(12) United States Patent
Zhang et al.

(10) Patent No.: US 12,382,763 B2
(45) Date of Patent: Aug. 5, 2025

(54) FULL-COLOR μLED MICRO-DISPLAY DEVICE WITHOUT ELECTRICAL CONTACT AND A MANUFACTURING METHOD THEREFOR

(71) Applicants: FUZHOU UNIVERSITY, Fujian (CN); MINDU INNOVATION LAB, Fujian (CN)

(72) Inventors: Yongai Zhang, Fujian (CN); Shiyao Chen, Fujian (CN); Tailiangi Guo, Fujian (CN); Xiongtu Zhou, Fujian (CN); Chaoxing Wu, Fujian (CN); Zhixian Lin, Fujian (CN); Lei Sun, Fujian (CN); Qun Yan, Fujian (CN)

(73) Assignees: FUZHOU UNIVERSITY, Fuzhou (CN); MINDU INNOVATION LAB, Fujian (CN)

( * ) Notice: Subject to any disclaimer, the term of this patent is extended or adjusted under 35 U.S.C. 154(b) by 617 days.

(21) Appl. No.: 17/768,472

(22) PCT Filed: Aug. 31, 2020

(86) PCT No.: PCT/CN2020/112394
§ 371 (c)(1),
(2) Date: Apr. 13, 2022

(87) PCT Pub. No.: WO2021/073282
PCT Pub. Date: Apr. 22, 2021

(65) Prior Publication Data
US 2023/0352642 A1    Nov. 2, 2023

(30) Foreign Application Priority Data
Oct. 16, 2019   (CN) .......................... 201910982320.4

(51) Int. Cl.
*H01L 25/075*   (2006.01)
*H10H 20/851*   (2025.01)
(Continued)

(52) U.S. Cl.
CPC ....... *H10H 20/857* (2025.01); *H01L 25/0756* (2013.01); *H10H 20/8515* (2025.01); *H10H 20/0364* (2025.01)

(58) Field of Classification Search
CPC ............. H10H 20/857; H10H 20/8515; H10H 20/0364; H10H 20/812; H01L 25/0756;
(Continued)

(56) References Cited

FOREIGN PATENT DOCUMENTS

CN    105304684    * 11/2015

* cited by examiner

*Primary Examiner* — Cuong B Nguyen
(74) *Attorney, Agent, or Firm* — Jose Cherson Weissbrot (57) ABSTRACT

The present invention relates to a full-color μLED micro-display device without electrical contact and a manufacturing method therefor. The device includes a lower driving electrode and a reflective layer arranged on a surface of the lower transparent substrate, an upper driving electrode and a diffusion layer arranged on a surface of the upper transparent substrate, a wavelength down-conversion light-emitting layer and a blue μLED grain arranged between the upper and lower driving electrodes, and a control module and a color filter film; the upper and lower driving electrodes are in no electrical contact with the blue μLED grain, the control module is in an electrical contact with the upper and lower driving electrodes, and the control module provides an alternating driving signal for controlling the μLED grain to excite a first light source which is converted into a second light source after passing through the wavelength down-conversion light-emitting layer, and after passing through the reflective layer and the diffusion layer, the first and (Continued)

second light sources achieve the full-color µLED microdisplay through the color filter film. The present invention can effectively avoid the complex process for manufacturing tricolor µLED chips in the full-color µLED device, as well as the complex bonding and mass transfer processes for the light-emitting chip and the driving chip, thereby shortening the cycle for manufacturing a µLED display, and cutting down the production cost.

10 Claims, 3 Drawing Sheets (51) Int. Cl.
*H10H 20/857* (2025.01)
*H10H 20/01* (2025.01)

(58) Field of Classification Search
CPC . H01L 25/167; H01L 25/075; H10D 30/0295; H10D 84/858; H10D 62/056; H10D 62/177; H10D 89/601; H10D 30/64; H10F 77/1228; G09G 3/32; G09G 2300/0421; G09G 3/2003; G09F 9/33
See application file for complete search history.

FULL-COLOR μLED MICRO-DISPLAY DEVICE WITHOUT ELECTRICAL CONTACT AND A MANUFACTURING METHOD THEREFOR

CROSS REFERENCE TO RELATED APPLICATIONS

This application is the national phase entry of International Application No. PCT/CN2020/112394, filed on Aug. 31, 2020, which is based upon and claims priority to Chinese Application No. CN 201910982320.4, filed on Oct. 16, 2019, the entire contents of which are incorporated herein by reference.

BACKGROUND OF THE INVENTION

Technical Field

The present invention relates to the field of integrated semiconductor display, and in particular, to a full-color μLED micro-display device without electrical contact and a manufacturing method therefor.

2. Description of Related Art

In the field of flat panel display technologies, micron LED display (referred to as μLED display) refers to the miniaturization of conventional LED to form a micron-pitch LED array to achieve ultra-high-density pixel resolution. The μLED display has a self-luminous property, and compared with OLED and LCD displays, the μLED display features low power consumption, high brightness, ultra-high resolution, high color saturation, faster response speed, longer service life and higher work efficiency. In addition, the μLED display is the only display device with high luminous efficiency and low power consumption that can integrate driving, light emission, and signal transmission, and realize ultra-large-scale integrated light-emitting units. Due to its high density, small size, and super pixel properties, the μLED display will lead the third-generation display technologies featuring high-fidelity, interactive and personalized displays.

Due to the combination of the two major technical features of LCD and LED, the product performance is much higher than the existing TFT-LCD and OLED, and may be widely applied in flexible displays, vehicle displays, transparent displays, large-area displays, wearable displays, AR/VR and other fields. However, due to the problems such as size and quantity, there are still a series of technical difficulties in bonding, transfer, driving, colorization and the like with respect to micron LED integration.

At present, the full-color μLED display is generally epitaxially grown on a GaN or GaAs substrate by means of metal organic chemical vapor deposition (MOCVD), the red, green and blue tricolor μLED chips are prepared using many processes, and the tricolor μLED chips and driving chips are bound on a circuit substrate using the chip transfer and bonding processes to form full-color tricolor display pixels. Such a technique requires precise electrical contact between the driving electrode and the driving module in the μLED chip through precise alignment and bonding, and requires a huge number of μLED grains to pick, place and assemble; with respect to the colorization techniques, it may also be achieved through color conversion, optical prism synthesis, and emission of light with different wavelengths by controlling the structure and size of the LED. The color conversion of blue LED+red and green quantum dots is the mainstream technical route to achieve full-color μLED display. In the prior art processes, using the quantum dot technology to achieve Micro-LED full-color display is a common process optimization means, and there are now many available process technologies and preparation solutions. Chinese patents CN106356386A, CN108257949A, CN109256455A achieve full-color display by filling blue μLED chips with red quantum dot and green quantum dot units, but the blue μLED chips require cathodes and anodes to be made, and quantum dots need to be patterned as well, while the μLED chip is bonded with the driving electrode chip after passing through massive transfer, and the blue μLED chip can be driven to emit light only after the electrode is in contact, so as to achieve full-color display, which results in longer cycle for manufacturing a μLED device and high production cost.

In summary, the present invention presents a full-color μLED micro-display without electrical contact. The upper and lower driving electrodes in the device are in no electrical contact with the p-type semiconductor layer and the n-type semiconductor layer in the μLED grain. The control module is electrically connected with the upper driving electrode and the lower driving electrode separately, and provides alternating driving signals for the upper driving electrode and the lower driving electrode, and forms a driving electric field between the upper driving electrode and the lower driving electrode. The recombination of electrons and holes of the μLED grain is controlled and a first light source is emitted in the alternating driving electric field. The first light source is excited into a second light source by the wavelength down-conversion light-emitting layer, the first light source and the second light source are converted into a uniform third light source after passing through the reflective layer and the diffusion layer, and the third light source changes into red light, green light and blue light through the color filter film, thereby achieving full-color LED micro-display.

The present invention can avoid the complex process for manufacturing a tricolor chip in a μLED light-emitting device, as well as the complex bonding of the light-emitting chip and the driving chip, and mass transfer process for the μLED chip, effectively cutting down the manufacturing cycle and the production cost of a μLED device, which is expected to boost the market competitiveness of full-color μLED display.

BRIEF SUMMARY OF THE INVENTION

The objective of the present invention is to overcome the deficiencies of the prior art, and to provide a full-color μLED display device without electrical contact and without mass transfer, the upper driving electrode and lower driving electrode of the device are in no direct electrical contact with the blue μLED grain, a independent space is formed; the control module is electrically connected with the upper driving electrode and the lower driving electrode separately, provides alternating driving signals for the upper and lower driving electrodes, and forms a driving electric field between the upper driving electrode and the lower driving electrode; the recombination of electrons and holes of the μLED grain is controlled and a first light source is emitted in the driving electric field, the first light source is converted into a second light source after passing through the wavelength down-conversion light-emitting layer, the first light source and the second light source are mixed to form a uniform third light source after passing through the reflective layer and the diffusion layer; and the third light source achieves full-color μLED micro-display through the color filter film.

The present invention provides a full-color μLED display device without electrical contact and without mass transfer, which can effectively avoid the complex process for manufacturing a red/green/blue tricolor μLED chip, and avoid the complex bonding process and mass transfer process for μLED light-emitting chip and driving chip as well, thereby effectively shortening the cycle for manufacturing μLED, cutting down the production cost of μLED display, which is expected to boost the market competitiveness of full-color μLED display.

In order to achieve the foregoing objective, the technical solution of the present invention is: a full-color μLED micro-display device without electrical contact, including: a lower transparent substrate, an upper transparent substrate, a blue μLED grain, a wavelength down-conversion light-emitting layer, a control module, a frame-sealing body connecting the upper transparent substrate and lower transparent substrate, a vent arranged on the upper transparent substrate, a color filter film arranged on the upper transparent substrate, a reflective layer arranged on a surface of the lower transparent substrate, and a diffusion layer arranged on a surface of the upper transparent substrate, a lower driving electrode arranged above the upper transparent substrate, and an upper driving electrode arranged under the upper transparent substrate, the upper driving electrode and lower driving electrode are separately arranged on both sides of the blue μLED grain, and the wavelength down-conversion light-emitting layer is arranged between the upper driving electrode, the lower driving electrode and the blue μLED grain; the upper driving electrode and the lower driving electrode are in no direct electrical contact with the blue μLED grain, and a independent space is formed; the control module is electrically connected with the upper driving electrode and the lower driving electrode separately, the control module provides alternating driving signals for the upper and lower driving electrodes, and forms a driving electric field between the upper driving electrode and the lower driving electrode; the driving electric field controls the recombination of electrons and holes of the μLED grain and emits a first light source, the first light source is converted into a second light source after passing through the wavelength down-conversion light-emitting layer, and the first light source is mixed, after passing through the reflective layer, with the second light source by the diffusion layer to form a uniform third light source; the third light source achieves full-color PLED micro-display after passing through the color filter film.

In one embodiment of the present invention, the color filter film is arranged on the upper surface of the upper transparent substrate, and corresponds to the upper driving electrode; the color filter film sequentially constitutes unit R for red light display, unit G for green light display, and unit B for blue light display along the direction of the upper driving electrode; the unit R, unit G and unit B are arranged at equal intervals with black barriers directly filled between them.

In one embodiment of the present invention, the blue μLED grain is composed of multiple blue μLED chips connected in series along the vertical direction, or composed of multiple blue μLED chips connected in parallel along the horizontal direction, or composed of multiple blue μLED chips randomly stacked.

In one embodiment of the present invention, the blue μLED chip includes a p-type semiconductor material, a light-emitting structure and an n-type semiconductor material, and the p-type semiconductor material, the light-emitting structure and the n-type semiconductor material are stacked along the vertical direction to form a semiconductor junction.

In one embodiment of the present invention, the semiconductor junction includes one of, or a combination of a single semiconductor junction, a pair of semiconductor junctions, and multiple semiconductor junctions; the P-type semiconductor material has a thickness of 1 nm-2.0 μm, and the light-emitting structure has a thickness of 1 nm-1.0 μm, and the N-type semiconductor material has a thickness of 1 nm-2.5 μm.

In one embodiment of the present invention, the upper driving electrode is composed of multiple line electrodes in parallel to each other, and is arranged on a surface of the upper transparent substrate along the horizontal direction of the μLED grain; the lower driving electrode is composed of multiple line electrodes in parallel to each other, and is arranged on a surface of the lower transparent substrate along the vertical direction of the μLED grain, and the upper electrode and the lower electrode are perpendicular to each other with space between them, and a independent space can be formed.

In one embodiment of the present invention, the wavelength down-conversion light-emitting layer may be arranged on the surfaces of the upper driving electrode and the lower driving electrode, or may be arranged on an outer surface of the μLED grain, or may be mixed and wrapped with the μLED grain, and arranged within the independent space formed by the upper driving electrode and the lower driving electrode; the wavelength down-conversion light-emitting layer is a yellow quantum dot material, or may be a yellow phosphor material, or may be a material mixing yellow quantum dots and yellow phosphor; the wavelength down-conversion light-emitting layer excites, under the irradiation of light from the first light source emitted by the blue μLED grain, the second light source with a longer wavelength, and the second light source is yellow light.

In one embodiment of the present invention, the control module can provide an alternating voltage whose amplitude and polarity change with time; the waveform of the alternating voltage is a composite waveform of one or more of sine wave, triangle wave, square wave and pulse; the frequency of the alternating voltage is 1 Hz-1000 MHz.

The present invention further provides a manufacturing method based on the foregoing full-color μLED micro-display device with electrical contact, which is implemented according to the following steps:

Step S1, provide a upper transparent substrate with a vent, and sequentially deposit a diffusion layer and an upper driving electrode on one surface of the upper transparent substrate by means of physical vapor deposition or chemical vapor deposition or printing or inkjet printing; the diffusion layer mixes the first light source and the second light source and turns them into a third light source that emits uniform light; the upper driving electrode is a transparent electrode, the material of which comprises graphene, indium tin oxide, carbon nanotube, silver nanowire, copper nanowire and a combination thereof;

Step S2, prepare a color filter film on a surface of the upper transparent substrate by means of photolithography or screen printing, the color filter film unit R, unit G and unit B are in one-to-one correspondence with the upper driving electrode; the unit R, unit G and unit B are arranged at equal intervals with black barriers directly filled between them;

Step S3, provide a lower transparent substrate, and deposit a reflective layer and a lower driving electrode on a surface of the lower transparent substrate by means of physical vapor deposition or chemical vapor deposition or printing or inkjet printing; the reflective layer reflects back the first light source, the second light source, and the third light source formed after the first light source and the second light source are mixed, thereby improving the device efficiency; the material of the lower driving electrode comprises gold, silver, aluminum, copper, and an alloy or laminated structure thereof;

Step S4, coat the frame-sealing body around the lower transparent substrate by means of screen printing, inkjet printing or scrape coating;

Step S5, provide a wavelength down-conversion light-emitting layer: coat surfaces of the upper driving electrode and the lower driving electrode with a layer of a wavelength down-conversion light-emitting layer by means of screen printing or inkjet printing or spray coating or spin coating;

Step S6, provide a blue μLED grain: coat a surface of the wavelength down-conversion light-emitting layer with a layer of blue μLED chip by means of inkjet printing or scrape coating or spraying;

Step S7, align the upper and lower transparent substrates for packaging, and degas via the vent for sealing off; and Step S8, provide a control module; the control module is electrically connected with the upper driving electrode and the lower driving electrode separately, the control module provides alternating driving signals for the upper driving electrode and the lower driving electrode, and forms a driving electric field between the upper driving electrode and the lower driving electrode; the driving electric field controls the recombination of electrons and holes of the μLED grain and emits a first light source, the first light source is converted into a second light source after passing through the wavelength down-conversion light-emitting layer, which are mixed to form a uniform third light source after passing through the reflective layer and the diffusion layer, and change into red light, green light, and blue light after passing through the color filter film, thereby achieving full-color μLED micro-display.

The present invention further provides a manufacturing method based on the foregoing full-color μLED micro-display device with electrical contact, which is implemented according to the following steps:

Step S1, provide a upper transparent substrate with a vent, and sequentially deposit a diffusion layer and an upper driving electrode on one surface of the upper transparent substrate by means of physical vapor deposition or chemical vapor deposition or printing or inkjet printing; the diffusion layer mixes the first light source and the second light source and turns them into a third light source that emits uniform light; the upper driving electrode is a transparent electrode, the material of which comprises graphene, indium tin oxide, carbon nanotube, silver nanowire, copper nanowire and a combination thereof;

Step S2, prepare a color filter film on a surface of the upper transparent substrate by means of photolithography or screen printing, the color filter film unit R, unit G and unit B are in one-to-one correspondence with the upper driving electrode; the unit R, unit G and unit B are arranged at equal intervals with black barriers directly filled between them;

Step S3, coat the frame-sealing body around the lower transparent substrate by means of screen printing, inkjet printing or scrape coating;

Step S4, provide a lower transparent substrate, and deposit a reflective layer and a lower driving electrode on a surface of the lower transparent substrate by means of physical vapor deposition or chemical vapor deposition or printing or inkjet printing; the reflective layer reflects back the first light source, the second light source, and the third light source formed after the first light source and the second light source are mixed, thereby improving the device efficiency; the material of the lower driving electrode comprises gold, silver, aluminum, copper, and their alloy or laminated structure;

Step S5, provide a blue μLED grain;

Step S6, provide a wavelength down-conversion light-emitting layer: evenly mix the wavelength down-conversion light-emitting layer and the blue μLED chip, mix and wrap the μLED grain and the wavelength down-conversion light-emitting layer together, and arrange them on a surface of the lower driving electrode by means of screen printing or inkjet printing or spray coating or spin coating;

Step S7, align the upper and lower transparent substrates for packaging, and degas via the vent for sealing off; and Step S8, provide a control module; the control module is electrically connected with the upper driving electrode and the lower driving electrode separately, the control module provides alternating driving signals for the upper driving electrode and the lower driving electrode, and forms a driving electric field between the upper driving electrode and the lower driving electrode; the driving electric field controls the recombination of electrons and holes of the μLED grain and emits a first light source, the first light source is converted into a second light source after passing through the wavelength down-conversion light-emitting layer, which change into red light, green light, and blue light after passing through the reflective layer and the diffusion layer and passing through the color filter film, thereby achieving full-color μLED micro-display.

Compared with the prior art, the present invention has the following beneficial effects:

(1) the upper and lower driving electrodes in the full-color μLED micro-display device presented by the present invention are in no electrical contact with the p-type semiconductor layer and the n-type semiconductor layer in the μLED grain, which can effectively avoid the complex process for manufacturing the μLED chip, as well as the complex bonding and transfer process for the LED light-emitting chip and the driving chip, thereby shortening the cycle for manufacturing μLED and cutting down the production cost of μLED display;

(2) the control module provided by the present invention is electrically connected with the upper driving electrode and the lower driving electrode separately, provides alternating driving signals for the upper driving electrode and the lower driving electrode, and forms a driving electric field between the upper driving electrode and the lower driving electrode; in such a driving mode, the luminous brightness of the μLED device without electrical contact can be effectively regulated by modulating the driving voltage and operating frequency;

(3) the alternating driving electric field presented by the present invention controls the recombination of electrons and holes of the μLED grain and emits a first light source. The first light source is excited into a second light source through the wavelength down-conversion light-emitting layer. The first light source and the second light source are converted into a uniform third light source after passing through the reflective layer and the diffusion layer. The third light source changes into red light, green light and blue light through the color filter film to achieve full-color μLED micro-display, which effectively improves the manufacturing process and production cost of the full-color μLED micro-display without electrical contact and is of great significance to the development and application of the full-color μLED display.

In the figures: 100 is a lower transparent substrate, 200 is an upper transparent substrate, 110 is a reflective layer, 210 is a diffusion layer, 120 is a lower driving electrode, 220 is an upper driving electrode, 300 is a wavelength down-conversion light-emitting layer, 400 is a μLED chip, 401 is an n-type semiconductor material, 402 is a p-type semiconductor material, 403 is a light-emitting structure, 500 is a frame-sealing body, 600 is a vent, 700 is a color filter film, 701 is unit R, 702 is unit G, and 703 is unit B, 704 is a black barrier layer, 800 is a control module, 111 is a first light source, 112 is a second light source, 113 is a third light source, 11 is red light, 12 is green light, and 13 is blue light.

DETAILED DESCRIPTION OF THE INVENTION

In order to make the objective, technical solution and advantages of the present invention clearer, the present invention will be further described in detail below with reference to specific embodiments and relevant accompany drawings. In the figures, the thicknesses of layers and regions are enlarged for clarity, but as schematic diagrams, they should not be construed as strictly reflecting the proportional relationships between geometric dimensions. The reference drawings herein are schematic illustrations of idealized embodiments of the present invention, the embodiments of the present invention should not be construed as limited to the particular shapes of the regions shown in the figures, but include the resulting shapes, such as deviation caused by manufacturing. In this embodiment, they are all represented by rectangles or circles, the representations in the figures are schematic, and should not be construed as limiting the scope of the present invention. In this embodiment, the size of the barrier undulation pattern and the undulation period are subject to a specific range. In the actual production, the size of the undulation pattern and its undulation period may be designed as actually needed. The numeric value of the undulation period in the embodiment is only an exemplary value, and it should not be construed as limiting the scope of the invention. It should be noted that the terms used herein are only for the purpose of describing specific implementations, and are not intended to limit the exemplary implementations according to the present application. As used herein, the singular is intended to include the plural unless the context otherwise expressly indicates. Furthermore, it should be understood that when the terms "comprise" and/or "include" are used in this specification, they indicate the presence of features, steps, operations, devices, components and/or combinations thereof.

The present invention provides a full-color μLED micro-display device without electrical contact, including: a lower transparent substrate, an upper transparent substrate, a blue μLED grain, a wavelength down-conversion light-emitting layer, a control module, a frame-sealing body connecting the upper transparent substrate and lower transparent substrate, a vent arranged on the upper transparent substrate, and a color filter film; a reflective layer and a lower driving electrode arranged on a surface of the lower substrate, and a diffusion layer and an upper driving electrode arranged on a surface of the upper transparent substrate;

The upper driving electrode and the lower driving electrode are arranged on both sides of the blue μLED grain, the wavelength down-conversion light-emitting layer is arranged between the upper driving electrode and the blue μLED grain, and the wavelength down-conversion light-emitting layer is arranged between the lower driving electrode and the blue μLED grain; the upper driving electrode and the lower driving electrode are in no direct electrical contact with the blue μLED grain, and a independent space is formed; the control module is electrically connected with the upper driving electrode and the lower driving electrode separately, the control module provides alternating driving signals for the upper and lower driving electrodes, and forms a driving electric field between the upper driving electrode and the lower driving electrode; the driving electric field controls the recombination of electrons and holes of the μLED grain and emits a first light source, the first light source is converted into a second light source after passing through the wavelength down-conversion light-emitting layer, the first light source and the second light source are mixed to form a uniform third light source after passing through the reflective layer and the diffusion layer; the third light source achieves full-color μLED micro-display after passing through the color filter film.

Figure 1:
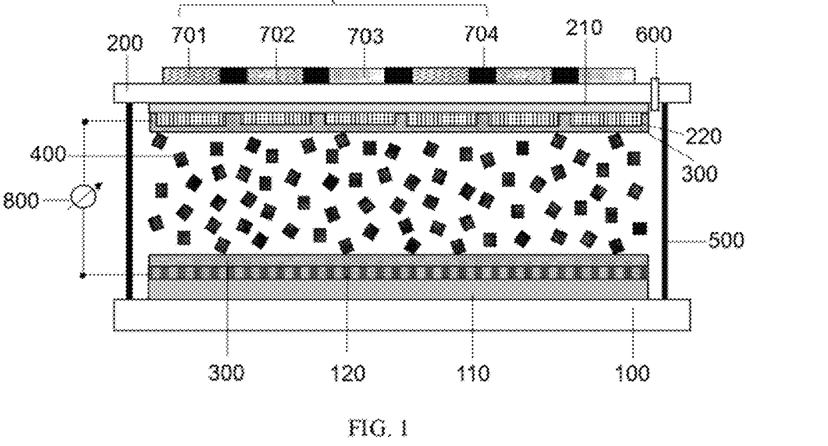
FIG. 1 is a schematic diagram of a structure of a full-color μLED micro-display without electrical contact according to a first embodiment of the present invention.

As shown in FIG. 1, a first embodiment of the present invention provides a full-color μLED micro-display device without electrical contact, including: a lower transparent substrate 100, an upper transparent substrate 200, a blue μLED grain, and a wavelength down-conversion light-emitting layer 300, a control module 800, a frame-sealing body 500 connecting the upper transparent substrate and the lower transparent substrate, and a sealing-off vent 600, and a color filter film 700; a reflective layer 110 and a lower driving electrode 120 arranged on a surface of the lower substrate, a diffusion layer 210 and an upper driving electrode 220 arranged on a surface of the upper transparent substrate; and further characterized in that, the upper driving electrode 220 and the lower driving electrode 120 are arranged on both sides of the blue μLED grain 400, and the wavelength down-conversion light-emitting layer 300 is arranged between the upper driving electrode 220 and the blue μLED grain 400, the wavelength down-conversion light-emitting layer 300 is arranged between the lower driving electrode 120 and the blue μLED grain 400; the upper driving electrode 220 and the lower driving electrode 120 are in no direct electrical contact with the blue μLED grain 400, and a independent space is formed; the control module 800 is electrically connected with the upper driving electrode 220 and the lower driving electrode 120 separately, the control module 800 provides alternating driving signals for the upper driving electrode 220 and the lower driving electrode 120, and forms a driving electric field between the upper driving electrode 220 and the lower driving electrode 120; the driving electric field controls the recombination of electrons and holes of the μLED grain 400 and emits a first light source 111, the first light source 111 is excited into a second light source 112 by the wavelength down-conversion light-emitting layer, the first light source 111 and the second light source 112 are mixed to form a third light source 113, the third light source 113 changes into red light 11, green light 12, and blue light 13 through the color filter film 700 after passing through the reflective layer and the diffusion layer, thereby achieving full-color μLED micro-display.

Figure 2:
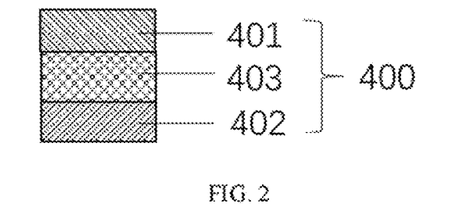
FIG. 2 is a schematic diagram of a structure of a randomly placed μLED chip according to a first embodiment of the present invention.
Figure 3:
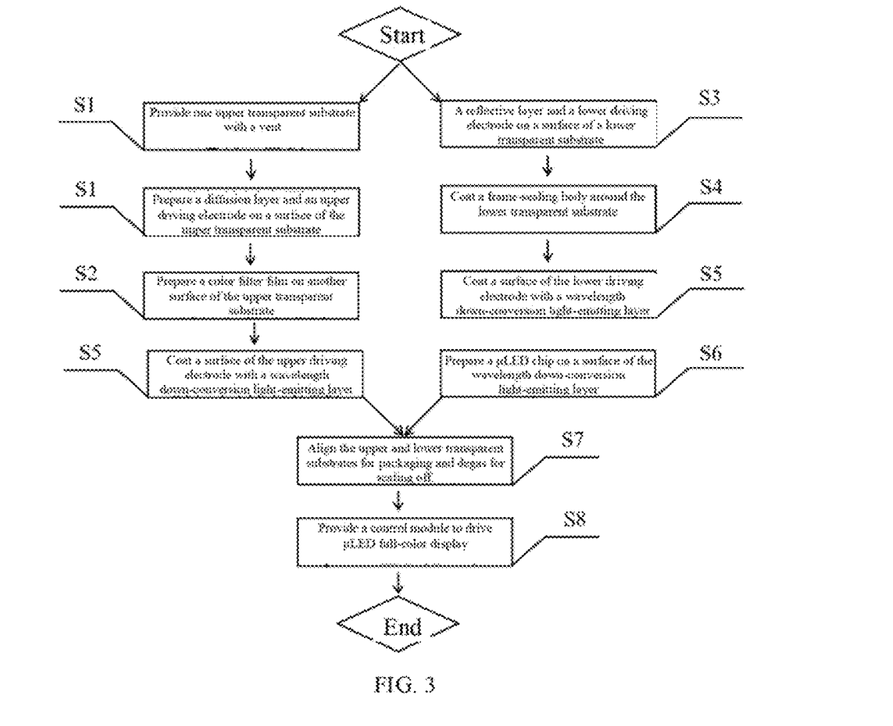
FIG. 3 is a flow chart for manufacturing a full-color μLED micro-display without electrical contact according to a first embodiment of the present invention.

Referring to FIG. 2 and FIG. 3, the present invention provides a method for manufacturing a full-color μLED micro-display device without electrical contact, the specific steps of which are as follows:

Step S1: provide a upper transparent substrate 200 with a vent 600, and sequentially deposit a diffusion layer 210 and an upper driving electrode 220 on one surface of the upper transparent substrate 200 by means of physical vapor deposition or chemical vapor deposition or printing or inkjet printing. The diffusion layer 210 mixes the first light source 111 and the second light source 112 and turns them into a third light source 113 that emits uniform light. The upper driving electrode 220 is a transparent electrode, the material of which may be but is not limited to graphene, indium tin oxide, carbon nanotube, silver nanowire, copper nanowire, and a combination thereof.

Step S2: prepare a color filter film 700 on a surface of the upper transparent substrate 200 by means of photolithography or screen printing. The color filter film unit R 701, unit G 702 and unit B 703 are in one-to-one correspondence with the upper driving electrode 220. The unit R, unit G and unit B are arranged at equal intervals with black barriers 704 directly filled between them.

Step S3: provide a lower transparent substrate 100, and deposit a reflective layer 110 and a lower driving electrode 120 on a surface of the lower transparent substrate 100 by means of physical vapor deposition or chemical vapor deposition or printing or inkjet printing. The reflective layer reflects back the first light source 111, the second light source 112, and the third light source 113 formed after the first light source 111 and the second light source are mixed, thereby improving the device efficiency; the material of the lower driving electrode may be but is not limited to gold, silver, aluminum, copper and an alloy or laminate structure thereof.

Step S4: coat the frame-sealing body 500 around the lower transparent substrate 200 by means of screen printing, inkjet printing or scrape coating.

Step S5: provide a wavelength down-conversion light-emitting layer 300. The wavelength down-conversion light-emitting layer excites a second light source with a longer wavelength under the irradiation of light from a first light source emitted by the blue μLED grain, and the second light source is yellow light; the wavelength down-conversion light-emitting layer may be arranged on the surfaces of the upper driving electrode and the lower driving electrode, or may be arranged on an outer surface of the μLED grain, or may be mixed and wrapped with the μLED grain, and are arranged within the independent space formed by the upper driving electrode and the lower driving electrode; the wavelength down-conversion light-emitting layer is a yellow quantum dot material, or may be a yellow phosphor material, or may be a material mixing yellow quantum dots and yellow phosphor. In this embodiment, preferably, the surfaces of the lower driving electrode 120 and the upper driving electrode 220 are coated with the yellow phosphor 400 by using a printing process.

Step S6: provide a blue μLED grain. The blue μLED grain is composed of multiple blue μLED chips connected in series along the vertical direction, or composed of multiple blue μLED chips connected in parallel along the horizontal direction, or composed of multiple blue μLED chips randomly stacked. The blue μLED chip includes a p-type semiconductor material, a light-emitting structure and an n-type semiconductor material (the p-type semiconductor material, light-emitting structure and n-type semiconductor material may be an organic material, an inorganic material or an polymer material). The p-type semiconductor material, light-emitting structure and n-type semiconductor material are stacked along the vertical direction to form a semiconductor junction. The semiconductor junction may include, but is not limited to, a single semiconductor junction (pn junction), a pair of semiconductor junctions (pnp, npn junction), multiple semiconductor junctions, and a combination thereof. The P-type semiconductor material has a thickness of 1 nm-2.0 μm, the light-emitting structure has a thickness of 1 nm-1.0 μm, and the N-type semiconductor material has a thickness of 1 nm-2.5 μm. In this embodiment, preferably, multiple blue μLED chips 400 are stacked randomly to form a μLED grain. The P-type semiconductor material 402 has a thickness of 0.2 μm, the light-emitting structure 403 has a thickness of 0.1 μm, and the n-type semiconductor material 401 has a thickness of 0.4 μm, as shown in FIG. 3.

Step S7: align the upper and lower transparent substrates 100, 200 for packaging, and degas via a vent 600 for sealing off.

Step S8: provide a control module 800. The control module 800 is electrically connected with the upper driving electrode 220 and the lower driving electrode 120 separately. The control module 800 provides alternating driving signals for the upper driving electrode 220 and the lower driving electrode 120, and forms a driving electric field between the upper driving electrode 220 and the lower driving electrode 120. The driving electric field controls the recombination of electrons and holes of the PLED grain and emits a first light source 111. The first light source 111 is converted into a second light source 112 after passing through the wavelength down-conversion light-emitting layer, which are mixed to form a uniform third light source 113 after passing through the reflective layer and the diffusion layer, and change into red light 11, green light 12, and blue light 13 through the color filter film 700, thereby achieving full-color μLED micro-display.

Figure 4:
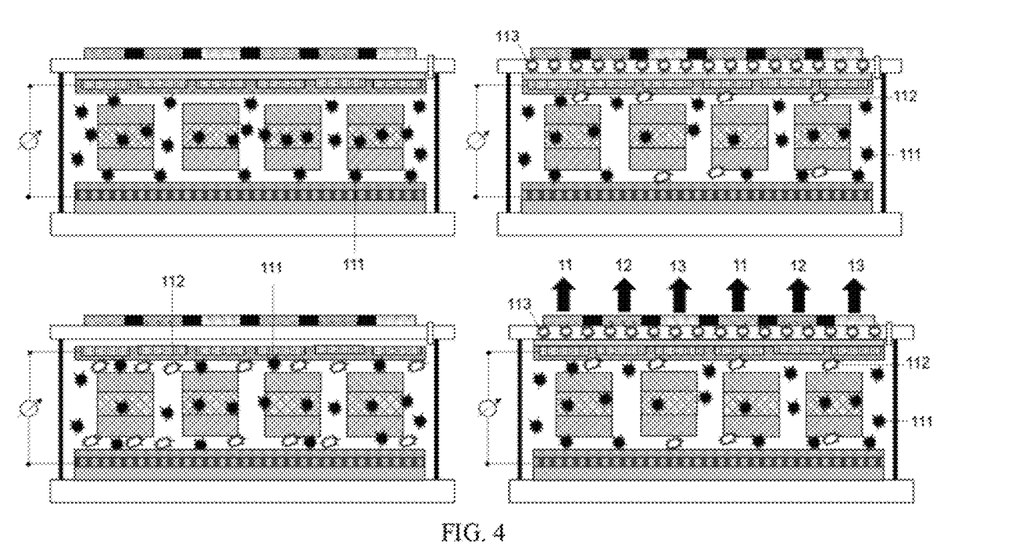
FIG. 4 is a diagram of operating principle of a full-color μLED micro-display without electrical contact according to a first embodiment of the present invention.

Referring to FIG. 4, the operating principle of the full-color PLED micro-display device without electrical contact provided by the present invention is as follows: when the control module 800 applies a AC signal, the P-type semiconductor material 402 in multiple μLED chips 400 provides holes diffused to the light-emitting structure 403, the n-type semiconductor material 401 provides electrons diffused to the light-emitting structure 403, and the electrons and holes recombine in the light-emitting structure 403 to emit the first light source 111; the first light source 111 excites the yellow quantum dot light-emitting layer 300 on the surfaces of the upper driving electrode 220 and the lower driving electrode 120 to emit the second light source 112, the first light source 111 and the second light source 112 are mixed to form a uniform third light source 113 after passing through the reflective layer 110 and the diffusion layer 210; the third light source 113 changes into red light 11, green light 12, and blue light 13 through the color filter film 700, thereby achieving full-color μLED micro-display.

Figure 5:
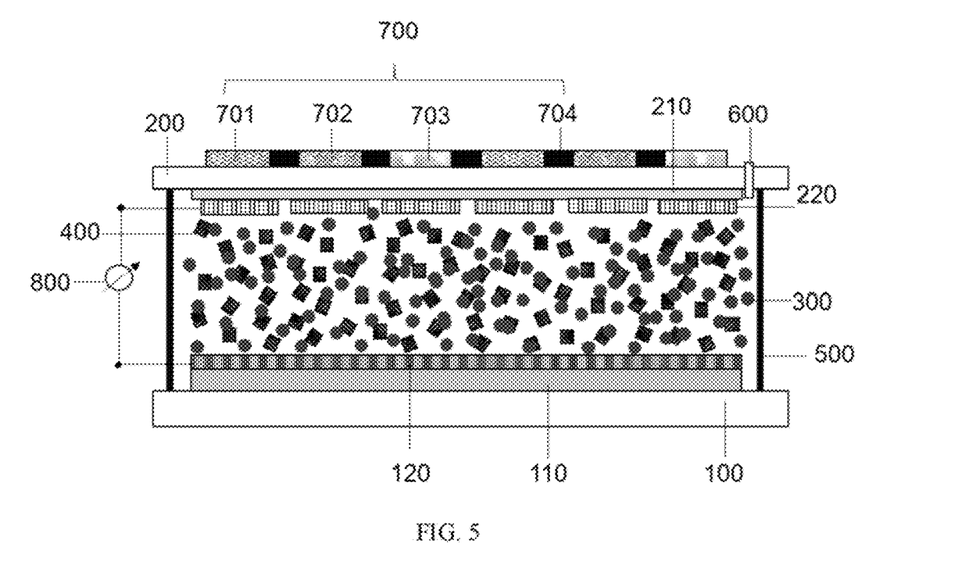
FIG. 5 is a schematic diagram of a structure of a full-color μLED micro-display without electrical contact according to a second embodiment of the present invention.

As shown in FIG. 5, a second embodiment of the present invention provides a full-color PLED micro-display device without electrical contact, including: a lower transparent substrate 100, an upper transparent substrate 200, a blue μLED grain, and a wavelength down-conversion light-emitting layer 300, a control module 800, a frame-sealing body 500 connecting the upper transparent substrate and the lower transparent substrate, a sealing-off vent 600, and a color filter film 700; a reflective layer 110 and a lower driving electrode 120 arranged on a surface of the lower substrate, a diffusion layer 210 and an upper driving electrode 220 arranged on a surface of the upper transparent substrate;

the upper driving electrode 220 and the lower driving electrode 120 are arranged on both sides of the blue μLED grain 400, and the wavelength down-conversion light-emitting layer 300 is arranged between the upper driving electrode 220 and the blue μLED grain 400, the wavelength down-conversion light-emitting layer 300 is arranged between the lower driving electrode 120 and the blue μLED grain 400; the upper driving electrode 220 and the lower driving electrode 120 are in no direct electrical contact with the blue μLED grain 400, and a independent space is formed; the control module 800 is electrically connected with the upper driving electrode 220 and the lower driving electrode 120 separately, the control module 800 provides alternating driving signals for the upper driving electrode 220 and the lower driving electrode 120, and forms a driving electric field between the upper driving electrode 220 and the lower driving electrode 120; the driving electric field controls the recombination of electrons and holes of the μLED grain 400 and emits a first light source 11, the first light source is converted into a second light source 112 after passing through the wavelength down-conversion light-emitting layer, which changes into red light 11, green light 12, and blue light 13 through the color filter film 700 after passing through the reflective layer and the diffusion layer, thereby achieving full-color μLED micro-display.

Figure 6:
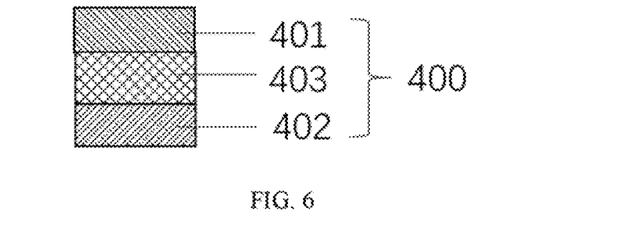
FIG. 6 is a schematic diagram of a structure of a randomly placed μLED chip according to a second embodiment of the present invention.
Figure 7:
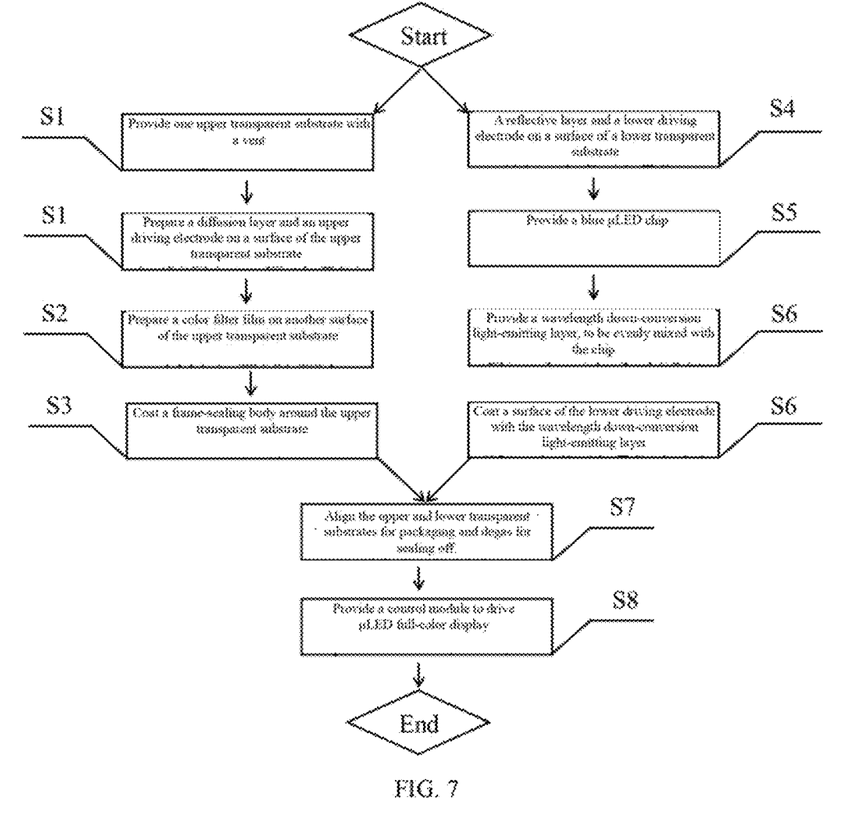
FIG. 7 is a flow chart for manufacturing a full-color LED micro-display without electrical contact according to a second embodiment of the present invention.

Referring to FIG. 6 and FIG. 7, the present invention provides a method for manufacturing a full-color μLED micro-display device without electrical contact, the specific steps of which are as follows:

Step S1: provide a upper transparent substrate 200 with a vent 600, and sequentially deposit a diffusion layer 210 and an upper driving electrode 220 on one surface of the upper transparent substrate 200 by means of physical vapor deposition or chemical vapor deposition or printing or inkjet printing. The diffusion layer 210 mixes the first light source 111 and the second light source 112 and turns them into a third light source 113 that emits uniform light. The upper driving electrode 220 is a transparent electrode, the material of which may be but is not limited to graphene, indium tin oxide, carbon nanotube, silver nanowire, copper nanowire, and a combination thereof.

Step S2: prepare a color filter film 700 on a surface of the upper transparent substrate 200 by means of photolithography or screen printing. The color filter film unit R 701, unit G 702 and unit B 703 are in one-to-one correspondence with the upper driving electrode 220. The unit R, unit G and unit B are arranged at equal intervals with black barriers 704 directly filled between them.

Step S3: coat the frame-sealing body 500 around the lower transparent substrate by means of screen printing, inkjet printing or scrape coating, Step S4: provide a lower transparent substrate 100, and deposit a reflective layer 110 and a lower driving electrode 120 on a surface of the lower transparent substrate 100 by means of physical vapor deposition or chemical vapor deposition or printing or inkjet printing. The reflective layer reflects back the first light source 111, the second light source 112, and the third light source 113 formed after the first light source 111 and the second light source are mixed, thereby improving the device efficiency; the material of the lower driving electrode may be but is not limited to gold, silver, aluminum, copper and an alloy or laminate structure thereof.

Step S5: provide a blue μLED grain. The blue μLED grain is composed of multiple blue μLED chips connected in series along the vertical direction, or composed of multiple blue μLED chips connected in parallel along the horizontal direction, or composed of multiple blue μLED chips randomly stacked. The blue μLED chip includes a p-type semiconductor material, a light-emitting structure and an n-type semiconductor material. The p-type semiconductor material, light-emitting structure and n-type semiconductor material are stacked along the vertical direction to form a semiconductor junction. The semiconductor junction may include, but is not limited to, a single semiconductor junction (pn junction), a pair of semiconductor junctions (pnp, npn junction), multiple semiconductor junctions, and a combination thereof. The P-type semiconductor material has a thickness of 1 nm-2.0 μm, the light-emitting structure has a thickness of 1 nm-1.0 μm, and the N-type semiconductor material has a thickness of 1 nm-2.5 μm. In this embodiment, preferably, multiple blue μLED chips 400 are stacked randomly to form a LED grain. The p-type semiconductor material 402 has a thickness of 0.2 μm, the light-emitting structure 403 has a thickness of 0.1 μm, and the n-type semiconductor material 401 has a thickness of 0.4 μm.

Step S6: provide a wavelength down-conversion light-emitting layer 300. The wavelength down-conversion light-emitting layer excites a second light source with a longer wavelength under the irradiation of light from a first light source emitted by the blue μLED grain, and the second light source is yellow light; the wavelength down-conversion light-emitting layer may be arranged on the surfaces of the upper driving electrode and the lower driving electrode, or may be arranged on an outer surface of the μLED grain, or may be mixed and wrapped with the μLED grain, and are arranged within the independent space formed by the upper driving electrode and the lower driving electrode; the wavelength down-conversion light-emitting layer is a yellow quantum dot material, or may be a yellow phosphor material, or may be a material mixing yellow quantum dots and yellow phosphor. In this embodiment, preferably, the yellow phosphor 300 and the blue μLED chip 400 are evenly mixed, the μLED chip and the wavelength down-conversion light-emitting layer are mixed and wrapped together, and arranged on a surface of the lower driving electrode 120 by means of screen printing or inkjet printing or spray coating or spin coating Step S7: align the upper and lower transparent substrates 100, 200 for packaging, and degas via a vent 600 for sealing off.

Step S8: provide a control module 800. The control module 800 is electrically connected with the upper driving electrode 220 and the lower driving electrode 120 separately. The control module 800 provides alternating driving signals for the upper driving electrode 220 and the lower driving electrode 120, and forms a driving electric field between the upper driving electrode 220 and the lower driving electrode 120. The driving electric field controls the recombination of electrons and holes of the μLED grain and emits a first light source 111. The first light source 111 is converted into a second light source 112 after passing through the wavelength down-conversion light-emitting layer, which change into red light 11, green light 12, and blue light 13 through the color filter film 700 after passing through the reflective layer and the diffusion layer, thereby achieving full-color μLED micro-display.

Figure 8:
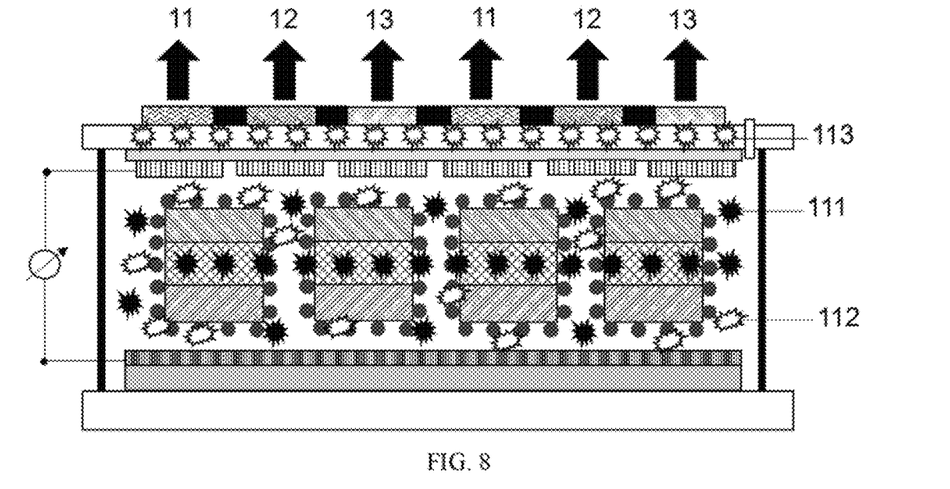
FIG. 8 is a diagram of operating principle of a full-color μLED micro-display without electrical contact according to a second embodiment of the present invention.

Referring to FIG. 8, the operating principle of a full-color μLED micro-display device without electrical contact provided by the present invention is as follows: when the control module 800 applies a AC signal, the P-type semiconductor material 402 in multiple μLED chips 400 provides holes diffused to the light-emitting structure 403, the n-type semiconductor material 401 provides electrons diffused to the light-emitting structure 403, and the electrons and holes recombine in the light-emitting structure 403 to emit the first light source 111; the first light source 111 excites the yellow phosphor light-emitting layer 300 on a surface of the μLED chip 400 to emit the second light source 112, the first light source 111 and the second light source 112 are mixed to form a uniform third light source 113 after passing through the reflective layer 110 and the diffusion layer 210; the third light source 113 changes into red light 11, green light 12, and blue light 13 through the color filter film 700, thereby achieving full-color μLED micro-display.

The foregoing are preferred embodiments of the present invention. All changes made on the basis of the technical solution of the present invention fall into the protection scope of the present invention if the resulting functional effects do not exceed the scope covered by the technical solution of the present invention.

What is claimed is:

1. A full-color micro-LED (μLED) micro-display device without electrical contact, comprising: a lower transparent substrate, an upper transparent substrate, a blue μLED grain, a wavelength down-conversion light-emitting layer, a control module, a frame-sealing body connecting the upper transparent substrate and lower transparent substrate, a vent arranged on the upper transparent substrate, a color filter film arranged on the upper transparent substrate, a reflective layer arranged on a surface of the lower transparent substrate, a diffusion layer arranged on a surface of the upper transparent substrate, a lower driving electrode arranged above the lower transparent substrate, and an upper driving electrode arranged under the upper transparent substrate, characterized in that, the upper driving electrode and lower driving electrode are separately arranged on both sides of the blue μLED grain, and the wavelength down-conversion light-emitting layer is arranged between the upper driving electrode, the lower driving electrode and the blue μLED grain; the upper driving electrode and the lower driving electrode are in no direct electrical contact with the blue μLED grain, and an independent space is formed between the upper driving electrode and the lower driving electrode; the control module is electrically connected with the upper driving electrode and the lower driving electrode separately, the control module provides alternating driving signals for the upper and lower driving electrodes, and forms a driving electric field between the upper driving electrode and the lower driving electrode; the driving electric field controls a recombination of electrons and holes of the blue μLED grain and emits a first light source, the first light source is converted into a second light source after passing through the wavelength down-conversion light-emitting layer, and the first light source is mixed, after passing through the reflective layer, with the second light source by the diffusion layer to form a uniform third light source; the third light source achieves full-color μLED micro-display after passing through the color filter film.

2. The full-color micro-LED (μLED) micro-display device without electrical contact according to claim 1, characterized in that, the color filter film is arranged on the upper surface of the upper transparent substrate, and corresponds to the upper driving electrode; the color filter film sequentially constitutes unit R for red light display, unit G for green light display, and unit B for blue light display along a direction of the upper driving electrode; the unit R, unit G and unit B are arranged at equal intervals, and black barriers are filled directly between each pair of adjacent units.

3. The full-color micro-LED (μLED) micro-display device without electrical contact according to claim 1, characterized in that, the blue μLED grain is composed of multiple blue μLED chips connected in series along a vertical direction, or composed of multiple blue μLED chips connected in parallel along a horizontal direction, or composed of multiple blue μLED chips randomly stacked.

4. The full-color micro-LED (μLED) micro-display device without electrical contact according to claim 3, characterized in that, the blue μLED chip comprises a p-type semiconductor material, a light-emitting structure and an n-type semiconductor material, and the p-type semiconductor material, the light-emitting structure and the n-type semiconductor material are stacked along the vertical direction to form a semiconductor junction.

5. The full-color micro-LED (μLED) micro-display device without electrical contact according to claim 4, characterized in that, the semiconductor junction comprises one of, or a combination of a single semiconductor junction, a pair of semiconductor junctions, and multiple semiconductor junctions; the P-type semiconductor material has a thickness of 1 nm-2.0 μm, the light-emitting structure has a thickness of 1 nm-1.0 μm, and the N-type semiconductor material has a thickness of 1 nm-2.5 μm.

6. The full-color micro-LED (μLED) micro-display device without electrical contact according to claim 1, characterized in that, the upper driving electrode is composed of multiple line electrodes in parallel to each other, and is arranged on a surface of the upper transparent substrate along a horizontal direction of the blue μLED grain; the lower driving electrode is composed of multiple line electrodes in parallel to each other, and is arranged on a surface of the lower transparent substrate along a vertical direction of the blue μLED grain, and the upper driving electrode and the lower driving electrode are perpendicular to each other with space between the upper driving electrode and the lower driving electrode.

7. The full-color micro-LED (μLED) micro-display device without electrical contact according to claim 1, characterized in that, the wavelength down-conversion light-emitting layer may be arranged on surfaces of the upper driving electrode and the lower driving electrode, or may be arranged on an outer surface of the blue μLED grain, or may be mixed and wrapped with the blue μLED grain, and arranged within the independent space formed by the upper driving electrode and the lower driving electrode; the wavelength down-conversion light-emitting layer is a yellow quantum dot material, or may be a yellow phosphor material, or may be a material mixing yellow quantum dots and yellow phosphor; the wavelength down-conversion light-emitting layer excites, under an irradiation of light from the first light source emitted by the blue μLED grain, the second light source with a longer wavelength, and the second light source is yellow light.

8. The full-color micro-LED (μLED) micro-display device without electrical contact according to claim 1, characterized in that, the control module can provide an alternating voltage whose amplitude and polarity change with time; a waveform of the alternating voltage is a composite waveform of one or more of sine wave, triangle wave, square wave and pulse; a frequency of the alternating voltage is 1 Hz-1000 MHz.

9. A manufacturing method for a full-color micro-LED (μLED) micro-display device without electrical contact, the method comprises the following steps:
Step S1, providing an upper transparent substrate with a vent, and sequentially depositing a diffusion layer and an upper driving electrode on one surface of the upper transparent substrate by means of physical vapor deposition or chemical vapor deposition or printing or inkjet printing; the diffusion layer mixes a first light source and a second light source and turns them into the a light source that emits a uniform light; the upper driving electrode is a transparent electrode, and the material of the upper driving electrode comprises graphene, indium tin oxide, carbon nanotube, silver nanowire, copper nanowire and a combination thereof;
Step S2, preparing a color filter film on a surface of the upper transparent substrate by means of photolithography or screen printing, the color filter film comprises a unit R, a unit G and a unit B are in one-to-one correspondence with the upper driving electrode; the unit R, the unit G and the unit B are arranged at equal intervals, and a plurality of black barriers are filled directly between the unit R, the unit G and the unit B;
Step S3, providing a lower transparent substrate, and depositing a reflective layer and a lower driving electrode on a surface of the lower transparent substrate by means of a physical vapor deposition or a chemical vapor deposition or a printing or an inkjet printing; the reflective layer reflects back the first light source, the second light source, and the third light source formed after the first light source and the second light source are mixed, thereby improving the device efficiency; the material of the lower driving electrode comprises gold, silver, aluminum, copper, and an alloy or laminated structure thereof;
Step S4, coating a frame-sealing body around the lower transparent substrate by means of screen printing, inkjet printing or scrape coating;
Step S5, providing a wavelength down-conversion light-emitting layer and coating surfaces of the upper driving electrode and the lower driving electrode with a layer of the wavelength down-conversion light-emitting layer by means of screen printing or inkjet printing or spray coating or spin coating;
Step S6, providing a blue μLED grain: coat a surface of the wavelength down-conversion light-emitting layer with a layer of blue μLED chip by means of inkjet printing or scrape coating or spraying;
Step S7, aligning the upper transparent substrate and the lower transparent substrates for packaging, and degas via the vent for sealing off; and
Step S8, providing a control module; the control module is electrically connected with the upper driving electrode and the lower driving electrode separately, the control module provides alternating driving signals for the upper driving electrode and the lower driving electrode, and forms a driving electric field between the upper driving electrode and the lower driving electrode; the driving electric field controls the recombination of electrons and holes of the blue μLED grain and emits the first light source, the first light source is converted into the second light source after passing through the wavelength down-conversion light-emitting layer, which are mixed to form the uniform third light source after passing through the reflective layer and the diffusion layer, and change into red light, green light, and blue light after passing through the color filter film, thereby achieving full-color μLED micro-display.

10. A manufacturing method for a full-color micro-LED (μLED) micro-display device without electrical contact the method comprises the following steps:
Step S1, providing an upper transparent substrate with a vent, and sequentially depositing a diffusion layer and an upper driving electrode on one surface of the upper transparent substrate by means of physical vapor deposition or chemical vapor deposition or printing or inkjet printing; the diffusion layer mixes a first light source and a second light source and turns them into a third light source that emits a uniform light; the upper driving electrode is a transparent electrode, and the material of the upper driving electrode comprises graphene, indium tin oxide, carbon nanotube, silver nanowire, copper nanowire and a combination thereof;
Step S2, preparing a color filter film on a surface of the upper transparent substrate by means of photolithography or screen printing, the color filter film comprises a unit R, a unit G and a unit B are in one-to-one correspondence with the upper driving electrode; the unit R, the unit G and the unit B are arranged at equal intervals, and a plurality of black barriers are filled directly between the unit R the unit G and the unit B;
Step S3, coating a frame-sealing body around the lower transparent substrate by means of screen printing, inkjet printing or scrape coating;
Step S4, providing the lower transparent substrate, and depositing a reflective layer and a lower driving electrode on a surface of the lower transparent substrate by means of physical vapor deposition or chemical vapor deposition or printing or inkjet printing; the reflective layer reflects back the first light source, the second light source, and the third light source formed after the first light source and the second light source are mixed, thereby improving the device efficiency; the material of the lower driving electrode comprises gold, silver, aluminum, copper, and their alloy or laminated structure;

Step S5, providing a blue μLED grain;

Step S6, providing a wavelength down-conversion light-emitting layer: evenly mix the wavelength down-conversion light-emitting layer and a plurality of blue μLED chips, mix and wrap the blue μLED grain and the wavelength down-conversion light-emitting layer together, and arrange the combined mixture on a surface of the lower driving electrode by means of screen printing or inkjet printing or spray coating or spin coating;

Step S7, aligning the upper transparent substrate and the lower transparent substrates for packaging, and degas via the vent for sealing off; and Step S8, providing a control module; the control module is electrically connected with the upper driving electrode and the lower driving electrode separately, the control module provides alternating driving signals for the upper driving electrode and the lower driving electrode, and forms a driving electric field between the upper driving electrode and the lower driving electrode; the driving electric field controls the recombination of electrons and holes of the blue μLED grain and emits the first light source, the first light source is converted into the second light source after passing through the wavelength down-conversion light-emitting layer, which change into red light, green light, and blue light after passing through the reflective layer and the diffusion layer and passing through the color filter film, thereby achieving full-color μLED micro-display.

\* \* \* \* \*